United States Patent
Spikes, Jr. et al.

[11] Patent Number: 6,110,785
[45] Date of Patent: Aug. 29, 2000

[54] FORMULATION OF HIGH PERFORMANCE TRANSISTORS USING GATE TRIM ETCH PROCESS

[75] Inventors: Thomas E. Spikes, Jr., Round Rock; Mark I. Gardner, Cedar Creek; Anthony J. Toprac, Austin, all of Tex.

[73] Assignee: Advanced Micro Devices, Inc., Austin, Tex.

[21] Appl. No.: 09/069,533

[22] Filed: Apr. 29, 1998

[51] Int. Cl.[7] .................................................. H01L 21/336
[52] U.S. Cl. .......................... 438/299; 438/300; 438/301; 438/302; 438/303; 438/305; 438/306; 438/307; 438/229; 438/230
[58] Field of Search ..................................... 438/299, 300, 438/301, 303, 305, 306, 307, 229, 230, 231, 232, 514, 521, 527, 529

[56] References Cited

U.S. PATENT DOCUMENTS

| | | |
|---|---|---|
| 4,728,617 | 3/1988 | Woo et al. . |
| 4,837,180 | 6/1989 | Chao . |
| 5,032,535 | 7/1991 | Kamijo et al. . |
| 5,238,859 | 8/1993 | Kamijo et al. . |
| 5,424,234 | 6/1995 | Kwon . |
| 5,565,369 | 10/1996 | Ko . |
| 5,869,378 | 4/1996 | Michael . |

*Primary Examiner*—John F. Niebling
*Assistant Examiner*—Jonathan Hack
*Attorney, Agent, or Firm*—Williams, Morgan & Amerson, P.C.

[57] ABSTRACT

The present invention is directed to a new and improved technique for formation of metal oxide semiconductor field effect transistors. In particular, the method involves formation of an initial gate structure that is wider than the desired final channel length of the completed transistor. Thereafter, an initial heavy-doping step is applied to the drain and source regions of the device. The width of the gate structure is then patterned and etched back to the desired final channel length of the device. A second, light-doping LDD implant is performed to complete the source and drain regions of the finished device.

19 Claims, 1 Drawing Sheet

FORMULATION OF HIGH PERFORMANCE TRANSISTORS USING GATE TRIM ETCH PROCESS

BACKGROUND OF THE INVENTION

1. Field of the Invention

This invention generally relates to semiconductor processing, and, more particularly, to gate formation in metal oxide semiconductor transistors.

2. Description of the Related Art

One technique used in semiconductor processing for reducing so-called hot-carrier effects in metal oxide semiconductor field effect transistors is the formation of lightly-doped drain (LDD) structures. In traditional LDD structures, the source/drain is formed by two implantation steps. The first of these implantations is a light-doping step that is self-aligned to the gate electrode. The second step is a heavy-doping step that is self-aligned to two oxide sidewall spacers previously formed adjacent the gate electrode. After the first light-dopant implantation step, sidewall spacers are formed to protect a portion of the lightly-doped substrate adjacent the gate electrode during the subsequent heavy-doping implantation step.

Although LDD structures are advantageous for reducing hot-carrier effects, traditional methods of forming these type of structures results in increased fabrication complexity and associated costs. In particular, formation of the traditional sidewall spacers requires several processing steps, e.g., oxide deposition etching and cleaning, that increase fabrication complexity and the time and costs associated with these steps. The present invention is directed to a method of solving some or all of the aforementioned problems.

SUMMARY OF THE INVENTION

The present invention is directed to a method of forming metal oxide semiconductor transistors. The method comprises formation of an initial gate structure that is wider than the desired final channel length of the finished device. A heavy-doping implantation of the source and drain regions is then performed. Thereafter, the initial gate structure is patterned to be substantially similar in width as the desired final channel length of the semiconductor device. Lastly, a second light-doping of the source and drain regions is then performed to create the LDD structure useful for eliminating so-called hot-carrier effects.

BRIEF DESCRIPTION OF THE DRAWINGS

The invention may be best understood by reference to the following description taken in conjunction with the accompanying drawings, in which like reference numerals identify like elements, and in which.

Figure 1:
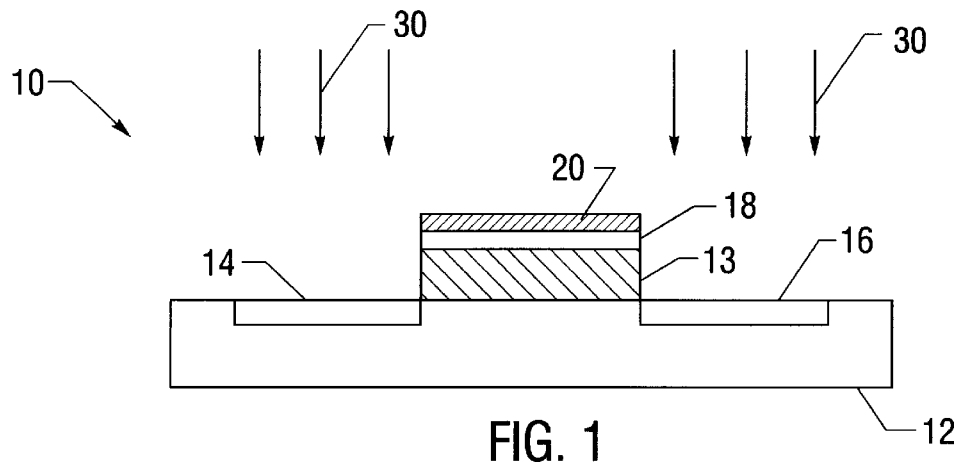
FIG. 1 is a cross-sectional view of the semiconductor device showing the initial gate structure and the initial heavy-doping source/drain implant.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

As shown in FIG. 1, a semiconductor device 10 is comprised of a substrate 12, gate structure 11, and source and drain regions 14, 16. The gate structure 11 may be comprised of a gate electrode layer 13 and one or more masking layers 18 and 20. Although not shown, there is a thin layer of silicon dioxide, a gate oxide, formed under the gate electrode layer 13. In one embodiment, the substrate 12 is silicon, the gate electrode layer 13 is polysilicon, the masking layer 18 is silicon oxynitride (SiOn), and the masking layer 20 is a photoresist. In one embodiment, the thickness of the polysilicon gate electrode layer may range from 1000–3000 Å, the thickness of the silicon oxynitride layer 18 may range from 50–200 Å, and the thickness of the photoresist layer 20 may range from 5000–15000 Å. Of course, as is readily apparent to those skilled in the art, the gate electrode layer 13 may be formed of any suitable material, e.g., polysilicon, as may be appropriate for the particular device under consideration. Additionally, one or more of the masking layers 18 or 20 may be omitted or other materials may be substituted, depending upon the particular technology and/or application. For example, the photoresist layer 20 may be omitted entirely after the initial patterning of the masking layer 18.

Initially, the gate electrode layer 13 and the masking layers 18, 20 are deposited and patterned so as to result in an initial gate structure that is wider than the desired final channel length of the operating device. The resulting structure is as shown in FIG. 1. Thereafter, a heavy-doping step (N+ in the case of NMOS technology), generally indicated by arrows 30, is carried out to partially form the source and drain regions 14 and 16 of the finished device. Typically, this heavy-doping step may be accomplished by ion implantation. The source and drain regions are self-aligned with the initial gate structure and bounded by field oxide areas (not shown) or silicon trench isolation areas (not shown). Thus, the initial gate structure may be sized to precisely define the boundary of the heavy-doped portions of the source and drain regions 14, 16.

Figure 2:
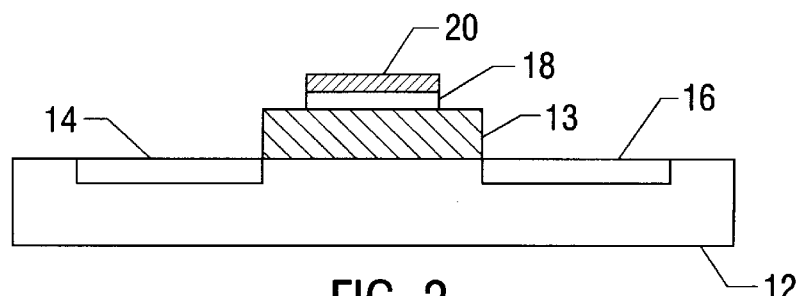
FIG. 2 is a cross-sectional view of the semiconductor device showing the gate structure after patterning of the masking layers.

As shown in FIG. 2, the masking layers 18 and 20 are patterned to expose a portion of the gate electrode layer 13. This patterning may be performed by a variety of techniques, depending upon the materials of construction of the masking layers 18, 20. In one embodiment, the silicon oxynitride layer 18 and photoresist layer 20 are patterned by etching. The etchant used must have a high degree of selectivity so as not to etch the underlying polysilicon layer 13. For example, in one embodiment, the etching is performed by plasma etching using, for example, HBr and Cl as the etchant gases.

Figure 3:
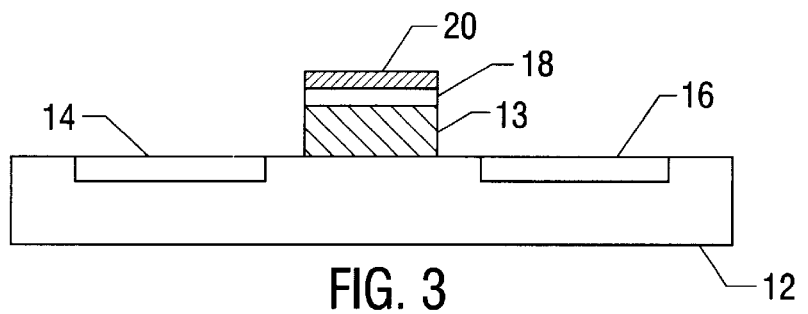
FIG. 3 is a cross-sectional view of the semiconductor device after the gate electrode has been patterned.

As shown in FIG. 3, the next step of the process involves reducing the width of the gate structure 11. In particular, the process involves patterning, e.g., etching, the gate electrode layer 13 so that the width of the gate electrode layer 13 is substantially similar to the final desired channel length of the semiconductor device 10. Of course, it is not necessary that the width of the gate electrode layer 13 after the second patterning step be equal to the desired final channel length of the finished device 10. Variations in the width of the gate electrode layer 11 as compared to the desired final channel length may be made as necessary to accomplish any design objective. The desired channel length of the finished device 10 may vary depending upon the particular technology involved. Additionally, as is readily understood by those skilled in the art, the exact dimensions of the gate electrode layer 13 and the actual channel length of the device, as fabricated, will vary due to changes caused by the various manufacturing processes.

Figure 4:
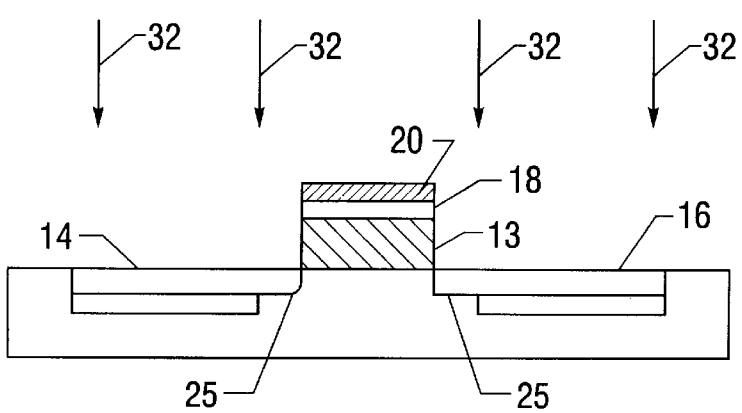
FIG. 4 is a cross-sectional view of the semiconductor device after the second light-doping LDD implant step.

Thereafter, as shown in FIG. 4, a second, light-doping implantation step, generally indicated by arrows 32, is performed on the source and drain regions 14, 16 to form an LDD structure 25 effective in reducing hot-carrier effects. The LDD structure 25 is self-aligned to the gate electrode 13. In one embodiment, this light-doping step may be accomplished by ion implantation.

The present invention is a new and improved method for formation of metal oxide semiconductor transistors. As will be readily apparent to those of ordinary skill in the art, the technique disclosed herein for the formation of semiconductor structures is readily applicable to a variety of semiconductor processing technologies, including NMOS, PMOS, and CMOS. Through use of the present technique to form LDD structures, the steps associated with formation of oxide spacers adjacent the gate electrode 13 are omitted. In this manner, processing complexity and costs are reduced.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method for forming a semiconductor device having source and drain regions and a desired final channel length, comprising:
    forming a gate structure having a first width comprising the steps of:
        forming a gate electrode layer, said gate electrode layer a top surface;
        forming at least one masking layer above the top surface of said gate electrode layer;
    performing a heavy-doping of the source and drain regions of the device;
    reducing the gate structure to a second width; and
    performing a light-doping of the source and drain regions of the device.

2. The method as set forth in claim 1, wherein reducing the gate structure to a second width comprises reducing the gate structure to a second width that is substantially similar to the desired final channel length of the device.

3. The method as set forth in claim 1, wherein reducing the gate structure to a second width comprises reducing the gate structure to a second width that is approximately equal to the desired final channel length of the device.

4. The method of claim 1, wherein reducing the gate structure to a second width comprises:
    patterning said at least one masking layer to a second width that is substantially similar to the desired final channel length of the device; and
    etching said gate electrode layer to a second width that is substantially similar to the desired final channel length of the device.

5. The method as set forth in claim 1, wherein forming said gate electrode layer comprises depositing a layer of polysilicon.

6. The method as set forth in claim 1, wherein forming said at least one masking layer comprises depositing at least one layer of silicon oxynitride.

7. The method as set forth in claim 1, wherein forming a gate electrode layer and at least one masking layer and patterning said gate electrode layer and said at least one masking layer to a width that is greater than the desired final channel length of the device comprises:
    depositing a layer of polysilicon;
    depositing a layer of silicon oxynitride on said layer of polysilicon; and
    etching said polysilicon and silicon oxynitride layers to a width that is greater than the desired final channel length of the device.

8. The method of claim 7, wherein reducing the gate structure to a second width comprises:
    patterning said layer of silicon oxynitride to a second width that is substantially similar to the desired final channel length of the device; and
    etching said polysilicon layer to a second width that is substantially similar to the desired final channel length of the device.

9. The method as set forth in claim 1, wherein patterning said gate electrode layer comprises etching said gate electrode layer.

10. The method as set forth in claim 1, wherein patterning said gate electrode layer comprises performing photolithographic patterning.

11. The method as set forth in claim 1, wherein reducing the gate structure to a second width comprises etching said gate structure.

12. The method as set forth in claim 1, wherein reducing the gate structure to a second width comprises at least two etching steps.

13. The method as set forth in claim 1, wherein reducing the gate structure to a second width comprises performing photolithographic patterning.

14. A method for forming a semiconductor device having semiconductor regions and a desired final channel length, comprising:
    depositing a gate electrode layer, said gate electrode layer having a top surface;
    forming at least one masking layer above said top surface of said gate electrode layer;
    patterning said gate electrode layer and said at least one masking layer to a first width that is greater than the desired final channel length of the device;

performing a heavy doping of the source and drain regions of the drive;

reducing said gate electrode layer and said at least one masking layer to a second width that is substantially similar to the desired final channel length of the device; and performing a light-doping of the source and drain regions of the device.

15. The method of claim 14, wherein depositing a gate electrode layer and forming at least one masking layer comprises depositing a layer of polysilicon and depositing a layer of silicon oxynitride on said layer of polysilicon.

16. The method of claim 14, wherein reducing said gate electrode layer and said at least one masking layer comprises patterning said at least one masking layer to said second width and etching said gate electrode layer to said second width.

17. The method of claim 14, further comprising reducing said gate electrode layer and said at least one masking layer to a second width that is approximately equal to the desired final channel length of the device.

18. The method as set forth in claim 14, wherein patterning said gate electrode layer and said at least one masking layer is comprised of performing photolithographic patterning.

19. The method as set forth in claim 14, wherein reducing said gate electrode layer and said at least one masking layer comprises performing at least two etching steps.

\* \* \* \* \*